US011903157B2

(12) United States Patent
Lin

(10) Patent No.: US 11,903,157 B2
(45) Date of Patent: *Feb. 13, 2024

(54) REUSABLE HOLDING COMPONENT FOR HEATSINK

(71) Applicant: Illinois Tool Works Inc., Glenview, IL (US)

(72) Inventor: Ming-Cheng Lin, Kaohsiung (TW)

(73) Assignee: Illinois Tool Works Inc., Glenview, IL (US)

(*) Notice: Subject to any disclaimer, the term of this patent is extended or adjusted under 35 U.S.C. 154(b) by 0 days.

This patent is subject to a terminal disclaimer.

(21) Appl. No.: 16/282,997

(22) Filed: Feb. 22, 2019

(65) Prior Publication Data

US 2020/0275572 A1    Aug. 27, 2020

(51) Int. Cl.
*H05K 7/12*   (2006.01)
*H05K 5/02*   (2006.01)
*H05K 7/20*   (2006.01)

(52) U.S. Cl.
CPC ............. *H05K 7/12* (2013.01); *H05K 5/0286* (2013.01); *H05K 7/20163* (2013.01)

(58) Field of Classification Search
CPC ....................................................... H05K 5/00
See application file for complete search history.

(56) References Cited

U.S. PATENT DOCUMENTS

| | | | | |
|---|---|---|---|---|
| 6,122,170 A * | 9/2000 | Hirose | .................. | C04B 37/026 174/16.3 |
| 6,392,889 B1 * | 5/2002 | Lee | .................... | H01L 23/4093 165/80.3 |
| 7,349,218 B2 | 3/2008 | Lu | | |
| 2004/0253077 A1 | 12/2004 | Aoki | | |
| 2005/0081225 A1 * | 4/2005 | Tanimoto | ............... | G11B 7/082 720/676 |
| 2008/0037225 A1 | 2/2008 | Yang | | |
| 2008/0135715 A1 * | 6/2008 | Chen | ...................... | G06F 1/181 248/544 |

(Continued)

FOREIGN PATENT DOCUMENTS

| | | |
|---|---|---|
| CN | 201422218 | 3/2010 |
| TW | I414228 | 11/2013 |

(Continued)

OTHER PUBLICATIONS

Int'l Search Report and Written Opinion Appln No. PCT/US2019/067557 dated Apr. 14, 2020.

(Continued)

*Primary Examiner* — Jerry Wu
(74) *Attorney, Agent, or Firm* — McAndrews, Held & Malloy, Ltd.

(57) ABSTRACT

A reusable holding component is provided. The reusable holding component may comprise a frame with a fastener receiving opening extending from a first surface of the frame to a second surface of the frame, and at least one pin disposed on and extending away from the second surface of the frame, wherein the at least one pin includes at least two elongated segments with hooks disposed on a head portion of each of the at least two elongated segments. A heat transfer device and an electronic device with a heatsink are also provided.

16 Claims, 7 Drawing Sheets

(56) References Cited

U.S. PATENT DOCUMENTS

2019/0052153 A1\* 2/2019 Usami ..................... B62M 6/55

FOREIGN PATENT DOCUMENTS

| TW | M602220 | 10/2020 |
| WO | 2015152855 | 10/2015 |

OTHER PUBLICATIONS

Non-Final Office Action U.S. Appl. No. 16/593,414 dated Sep. 17, 2020.
Final Office Action U.S. Appl. No. 16/593,414 dated Feb. 25, 2021.
Non-Final Office Action U.S. Appl. No. 16/593,414 dated Sep. 16, 2021.
Taiwanese Search Report Appln No. No. 108107403 dated Jul. 20, 2022. 3 pages.
Taiwanese Search Report Appln No. No. 108136352 dated Mar. 13, 2023.

\* cited by examiner

REUSABLE HOLDING COMPONENT FOR HEATSINK

FIELD OF THE DISCLOSURE

The present disclosure is related to a reusable holding component for a heatsink.

BACKGROUND

In a conventional computer assembly, heat dissipation is performed by attaching a heatsink on the top of a central processing unit (CPU). The heatsink may include a plurality of cooling fins on the top or sides of the heatsink to conduct heat from the top of the CPU to the bottom of the heatsink. Heat will be dissipated by the cooling fins.

The heatsink can be attached to a frame of a computer using a variety of attachment mechanisms, such as clamps, screws, and other hardware. One conventional fastener includes a screw with a head, a tapered ring, and a sealing ring. The tapered ring may be disposed on the screw below the head of the screw, and may have a tapered lower peripheral surface. The sealing ring may be disposed on the screw and engaging the tapered lower peripheral surface of the tapered ring. The conventional fastener may be disposed within a bore in the heatsink and threaded into a load frame for securing the heatsink to the load frame.

However, the structure of the conventional fastener for securing the heatsink to the load frame is complex. In addition, securing the heatsink by the conventional fastener to the load frame might take multiple steps and might destroy the structure of either the fastener or the load frame. Therefore, there is a need for improving the structure of the fastener and the heatsink.

SUMMARY

Embodiments of the present disclosure generally relate to a reusable holding component for a heatsink, a heat transfer device, and an electronic device with a heatsink. In one embodiment, a reusable holding component is provided. The reusable holding component may comprise a frame with a fastener receiving opening extending from a first surface of the frame to a second surface of the frame, and at least one pin disposed on and extending away from the second surface of the frame, wherein the at least one pin includes at least two elongated segments with hooks disposed on a head portion of each of the at least two elongated segments.

In another embodiment, a heat transfer device is provided. The heat transfer device may comprise a reusable holding component comprising a frame with a fastener receiving opening extending from a first surface of the frame to a second surface of the frame, and at least one pin disposed on and extending away from the second surface of the frame, wherein the at least one pin includes at least two elongated segments with hooks disposed on a head portion of each of the at least two elongated segments, and a heatsink connected to the heatsink by the at least one pin, and the heatsink has a fastener receiving opening aligned with the fastener receiving opening of the frame, and at least one guiding opening corresponding to the at least one pin of the reusable holding component.

In yet another embodiment, an electronic device is provided. The electronic device may comprise an electronic component supported by a base, a heatsink connected to the base for dissipating heat from the electronic component, a reusable holding component connected the heatsink comprising a frame with an opening extending from a first surface of the frame to a second surface of the frame, and at least one pin disposed on and extending away from the second surface of the frame, wherein the at least one pin includes at least two elongated segments with hooks disposed on a head portion of each of the at least two elongated segments, wherein the heatsink has a fastener receiving opening aligned with the fastener receiving opening of the frame, and at least one guiding opening corresponding to the at least one pin of the reusable holding component, wherein the base has a fastener receiving opening, wherein the fastener receiving opening of the base is aligned with the fastener receiving opening of the frame and the fastener receiving opening of the heatsink a fastener configured to secure the reusable holding component and the heatsink to the base through the fastener receiving opening of the frame, the fastener receiving opening of the heatsink, and the fastener receiving opening of the base.

The above and other embodiments of the present disclosure are described in more details in the following contexts.

BRIEF DESCRIPTION OF THE DRAWINGS

So that the manner in which the above described features of the present disclosure can be understood, a more specific description of the disclosure, briefly summarized above, may be had by reference to embodiments, some of which are illustrated in the appended drawings. However, the appended drawings illustrate only exemplary embodiments of this disclosure. It is to be understood that the disclosure may admit to other equally effective embodiments, and therefore the appended drawings should not be considered as limiting the scope of the present disclosure.

To facilitate understanding, identical reference numerals have been used, where possible, to designate identical elements that are common in the figures. For the sake of clarity, the various embodiments shown in the figures are not necessarily drawn to scale and are illustrative representations.

DETAILED DESCRIPTION

Now the embodiments of the present disclosure will be described in details with reference to the drawings.

Figure 1:
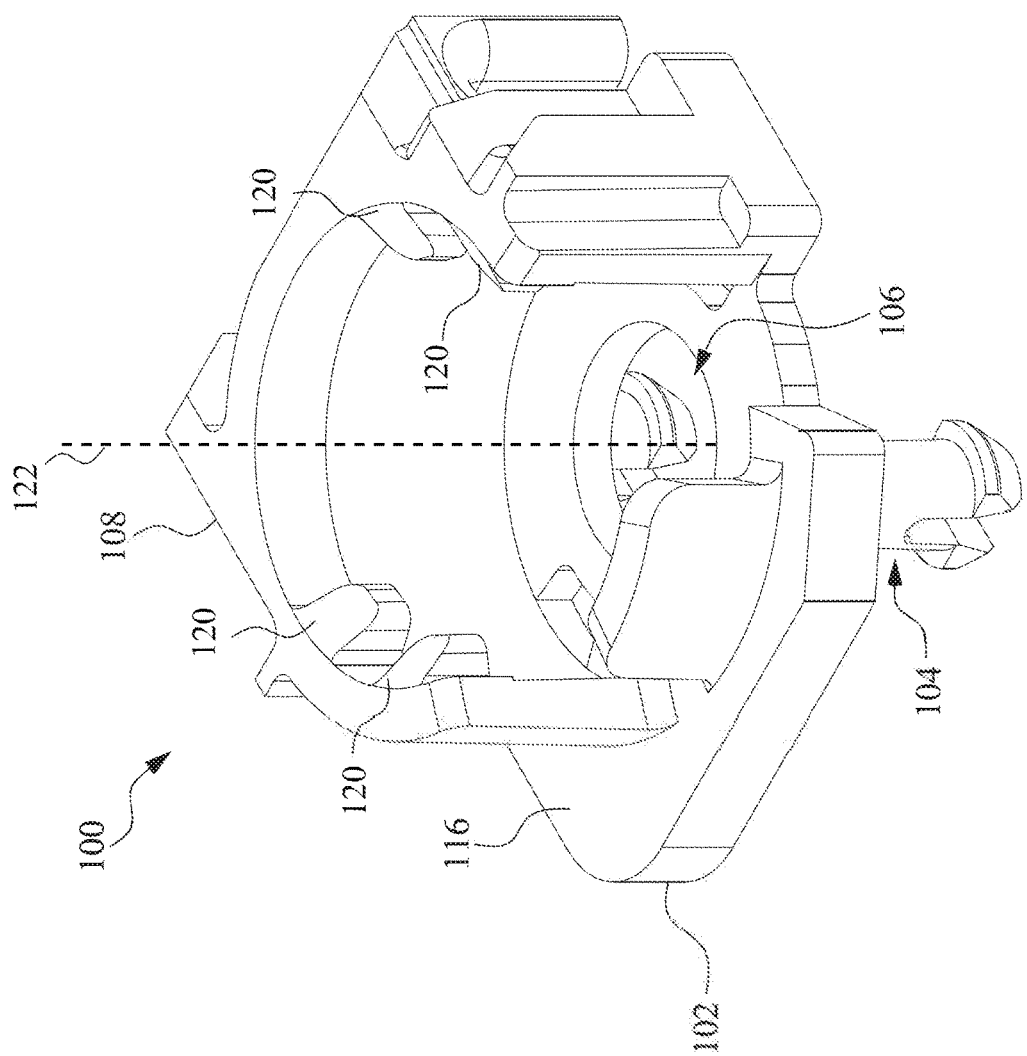
FIG. 1 illustrates a schematic view of a reusable holding component according to an embodiment of the present disclosure.
Figure 2:
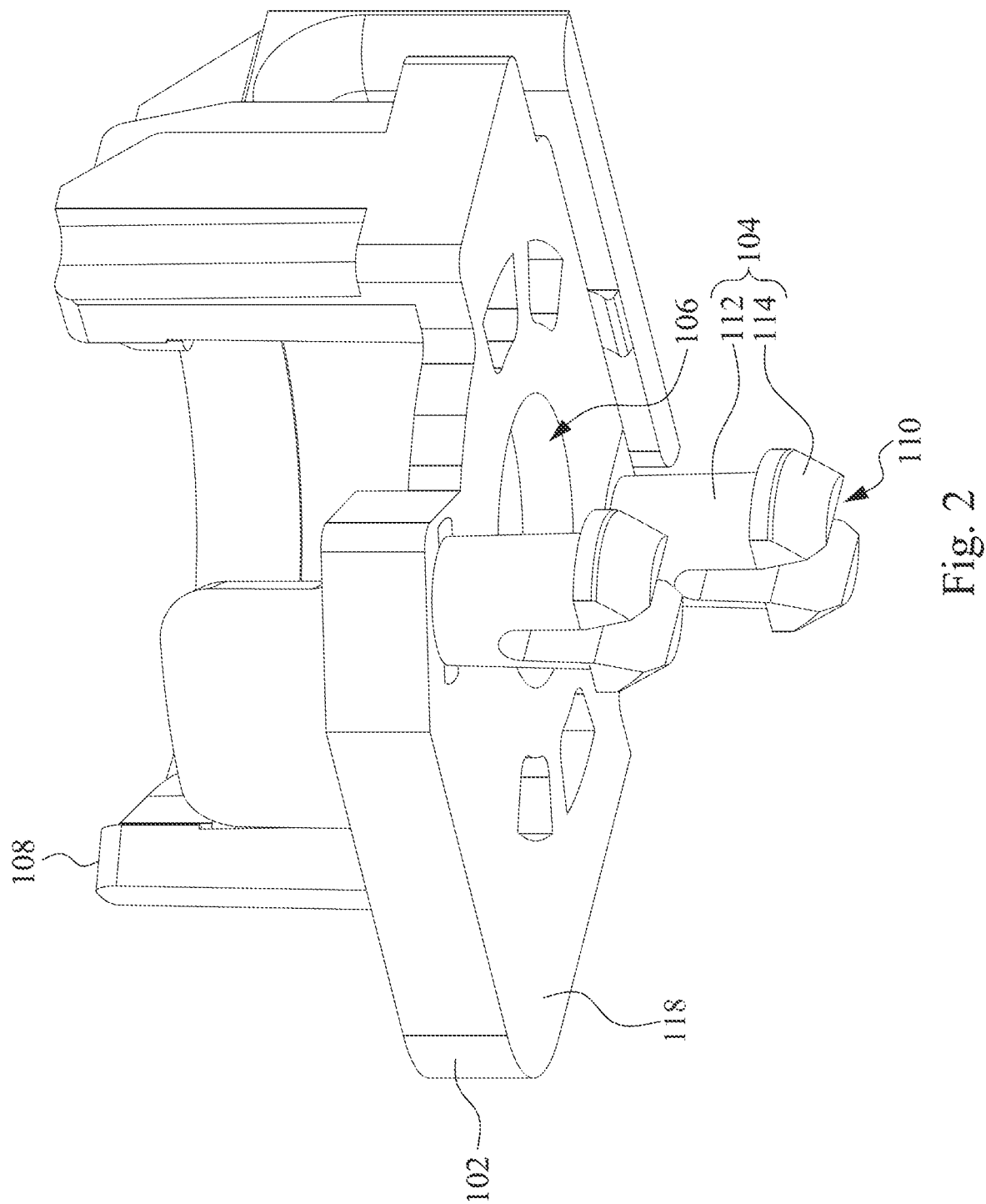
FIG. 2 illustrates another schematic view of the reusable holding component as shown in FIG. 1.

FIG. 1 illustrates a schematic view of a reusable holding component 100 according to an embodiment of the present disclosure, and FIG. 2 illustrates another schematic view of the reusable holding component 100 of FIG. 1. As shown in FIGS. 1 and 2, the reusable holding component 100 may include a frame 102 with a fastener receiving opening 106 and at least one pin 104. The fastener receiving opening 106 is formed in the frame 102 and extends from a top surface of the frame 102 to a bottom surface 118 of the frame 102. The at least one pin 104 is disposed on and extending away from the bottom surface 118 of the frame 102. The at least one pin 104 may pass through at least one corresponding hole of a heatsink, such that the reusable holding component 100 may be attached to the heatsink. As such, the reusable holding component 100 may hold the heatsink in place, so as to facilitate the subsequent mounting of the fastener into the base.

The reusable holding component 100 may further include a fastener guiding wall 108. The fastener guiding wall 108 is disposed on and extending away from the top surface 116 of the frame 102. In order to guide the placement of the fastener, the fastener guiding wall 108 may surround the fastener receiving opening 106 of the frame 102. In such way, the fastener guiding wall 108 will direct the fastener into the fastener receiving opening 106 of the frame 102 during installation of the fastener. The fastener guiding wall 108 also includes tabs 120 positioned on an opposite end of the fastener guiding wall 108 from the top surface of the frame 102. The tabs 120 extend inward from the fastener guiding wall 108 toward a center line 122 of the fastener receiving opening 106.

As shown in FIG. 2, the at least one pin 104 may include at least two elongated segments 112 with hooks 114. The hooks 114 are disposed on a head portion of each of the at least two elongated segments 112, and the hooks 114 are tapered off to a point of the head portion of each of the at least two elongated segments 112. The at least one pin 104 may extend vertically from the bottom surface 118 of the frame 102. The at least two elongated segments 112 are parallel with each other, and there is a gap 110 between the at least two elongated segments. In some embodiments, the at least two elongated segments 112 may be angled with each other.

The frame 102 may have a rectangular shape, and at least two pins 104 may be disposed substantially at diagonal corners on the bottom surface 118 of the frame 102. When the reusable holding component 100 is attached to the heatsink by the at least two pins 104, the at least two pins 104 at diagonal corners may ensure that the reusable holding component 100 is attached to the heatsink securely.

Figure 3:
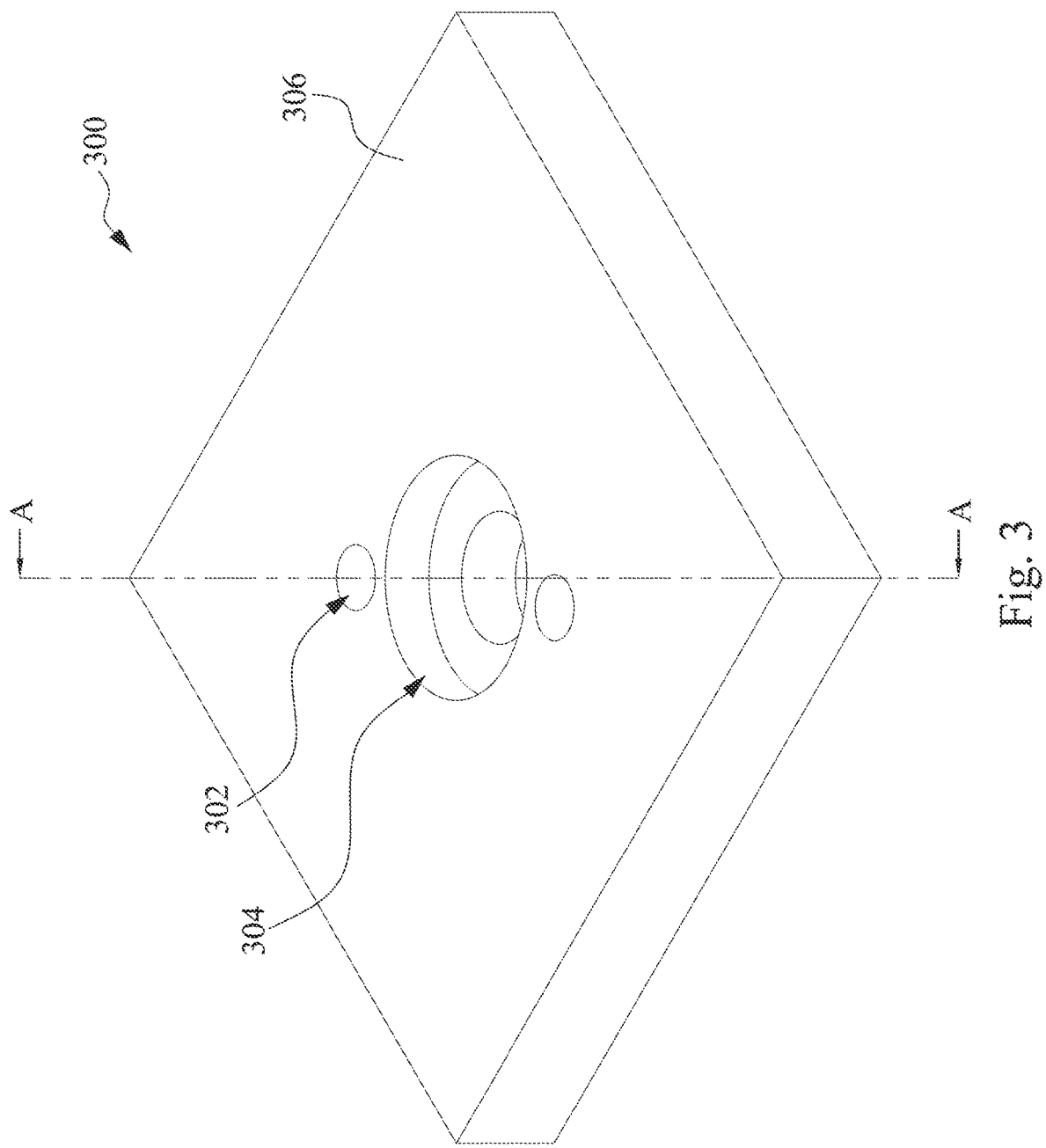
FIG. 3 illustrates a schematic view of a pedestal of a heatsink according to an embodiment of the present disclosure.
Figure 4:
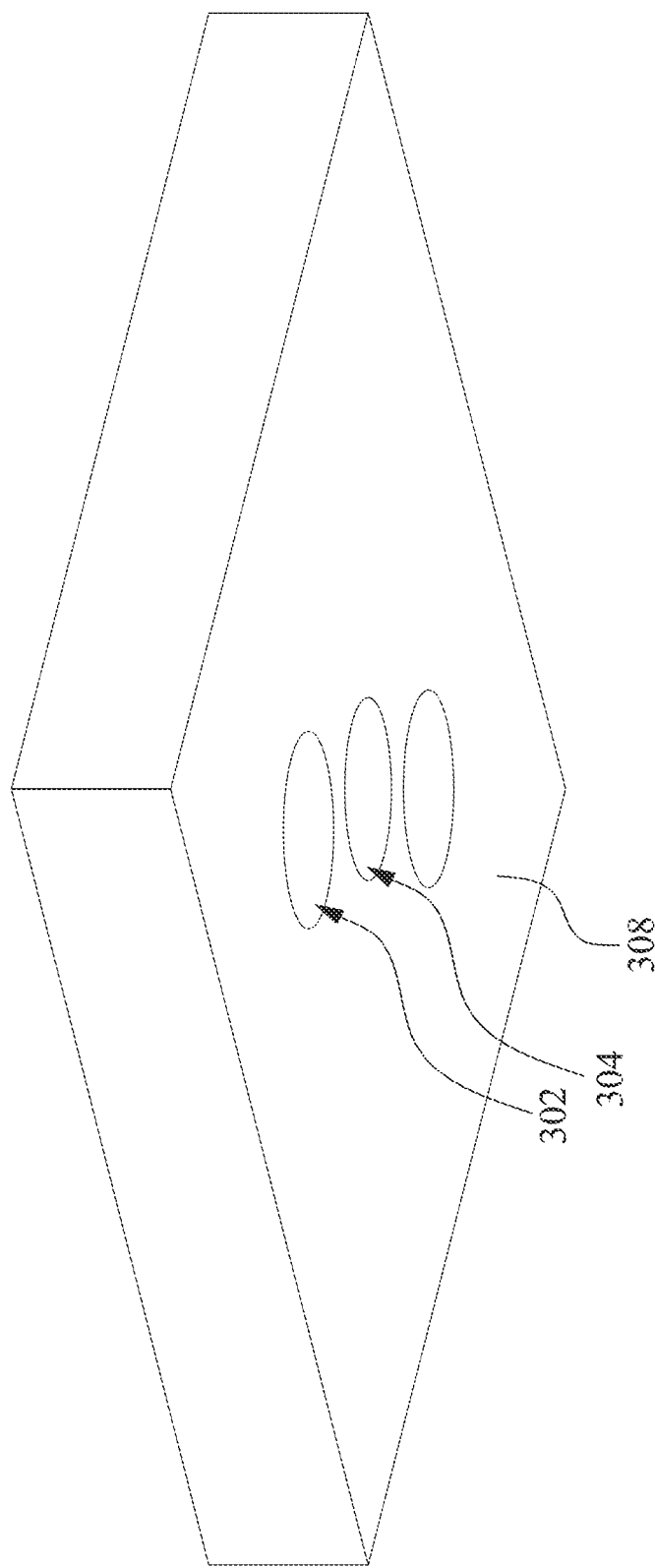
FIG. 4 illustrates another schematic view of the pedestal of the heatsink as shown in FIG. 3.
Figure 5:
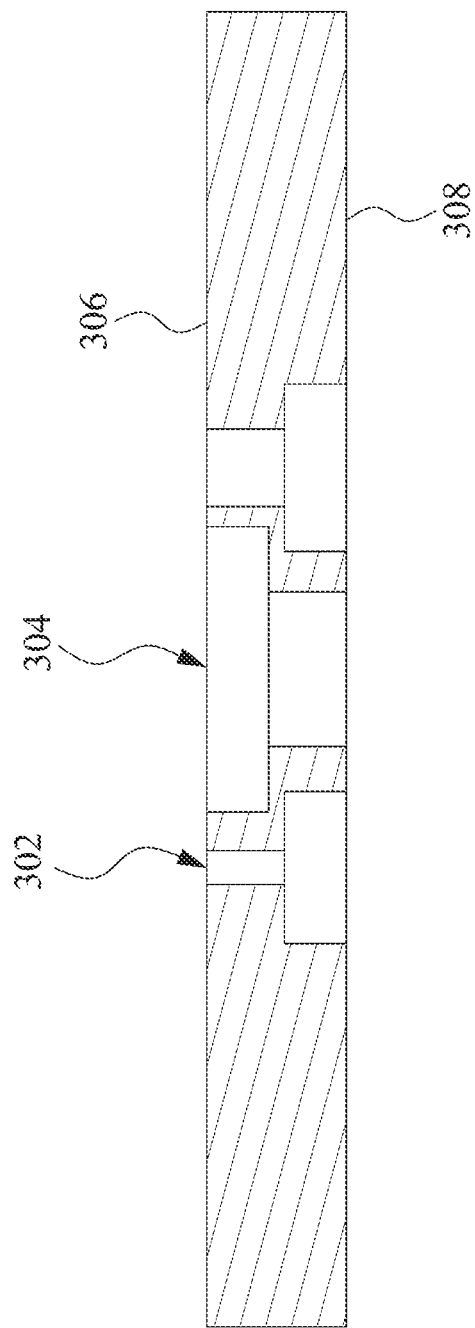
FIG. 5 illustrates a cross-section view of the pedestal of the heatsink taking from line A-A of FIG. 3.

FIG. 3 illustrates a schematic view of a pedestal 300 of a heatsink according to an embodiment of the present disclosure, FIG. 4 illustrates another schematic view of the pedestal 300 of the heatsink of FIG. 3, and FIG. 5 illustrates a cross-section view of the pedestal of the heatsink of FIG. 3.

Typically, heatsinks are formed with fins, pins or other similar structures to increase the surface area of the heatsink and thereby enhance heat dissipation. Heatsinks are typically formed of metals, such as copper or aluminum. The heatsinks are attached to a base using a variety of attachment mechanisms, such as clamps, screws, and other hardware for dissipating heat from an electronic component, and the electronic component is supported by the base to contact with heatsinks.

As shown in FIGS. 3 and 4, the pedestal 300 of the heatsink has a top surface 306 and a bottom surface 308, and has a fastener receiving opening 302 and at least one guiding opening 304. The fastener receiving opening 302 of the pedestal 300 of the heatsink and the at least one guiding opening 304 of the pedestal 300 of the heatsink may extend from the top surface 306 of the pedestal 300 of the heatsink to the bottom surface 308 of the pedestal 300 of the heatsink.

The at least one guiding opening 304 of the pedestal 300 of the heatsink corresponds to at least one pin of the reusable holding component as shown in FIGS. 1 and 2.

In some embodiment, at least two guiding openings 304 are disposed substantially at diagonal corners on the pedestal 300 of the heatsink. At least two pins of the reusable holding component at the corresponding diagonal corners may pass through the at least two guiding openings 304 to attach the reusable holding component to the pedestal 300 of the heatsink, to ensure that the reusable holding component is attached to the pedestal 300 of the heatsink securely.

As shown in FIG. 5, the at least one guiding opening 304 of the pedestal 300 of the heatsink may extend from the top surface 306 of the pedestal 300 of the heatsink to the bottom surface 308 of the pedestal 300 of the heatsink in a stepped way. The diameter of the at least one guiding opening 304 of the pedestal 300 of the heatsink at the top surface 306 of the pedestal 300 of the heatsink may be smaller than the diameter of at least one guiding opening 304 of the pedestal 300 of the heatsink at the bottom surface 308 of the pedestal 300 of the heatsink. In such way, the hooks of the at least one pin of the reusable holding component as shown in FIGS. 1 and 2 may hook within the at least one guiding opening 304 of the pedestal 300 of the heatsink to prevent the reusable holding component from removing the pedestal 300 of the heatsink.

In some embodiments, the at least one guiding opening 304 of the pedestal 300 of the heatsink may extend from the top surface 306 of the pedestal 300 of the heatsink to the bottom surface 308 of the pedestal 300 of the heatsink in a straight way, such that the hooks of the at least one pin of the reusable holding component may hook onto the bottom surface 308 of the pedestal 300 of the heatsink to prevent the reusable holding component from falling out of the pedestal 300 easily.

Still referring to FIG. 5, the fastener receiving opening 302 of the pedestal 300 of the heatsink extends from the top surface 306 of the pedestal 300 of the heatsink to the bottom surface 308 of the pedestal 300 of the heatsink in a stepped way. The diameter of the fastener receiving opening 302 of the pedestal 300 of the heatsink at the top surface 306 of the pedestal 300 of the heatsink is larger than the diameter of the fastener receiving opening of the pedestal 300 of the heatsink at the bottom surface 308 of the pedestal 300 of the heatsink. In such way, the operator may choose the size of the fastener to fit the diameter of the fastener receiving opening 302 of the pedestal 300 of the heatsink at the bottom surface 308 of the pedestal 300 of the heatsink, and may operate the fastener to pass through the fastener receiving opening 302 of the pedestal 300 of the heatsink easily.

Figure 6:
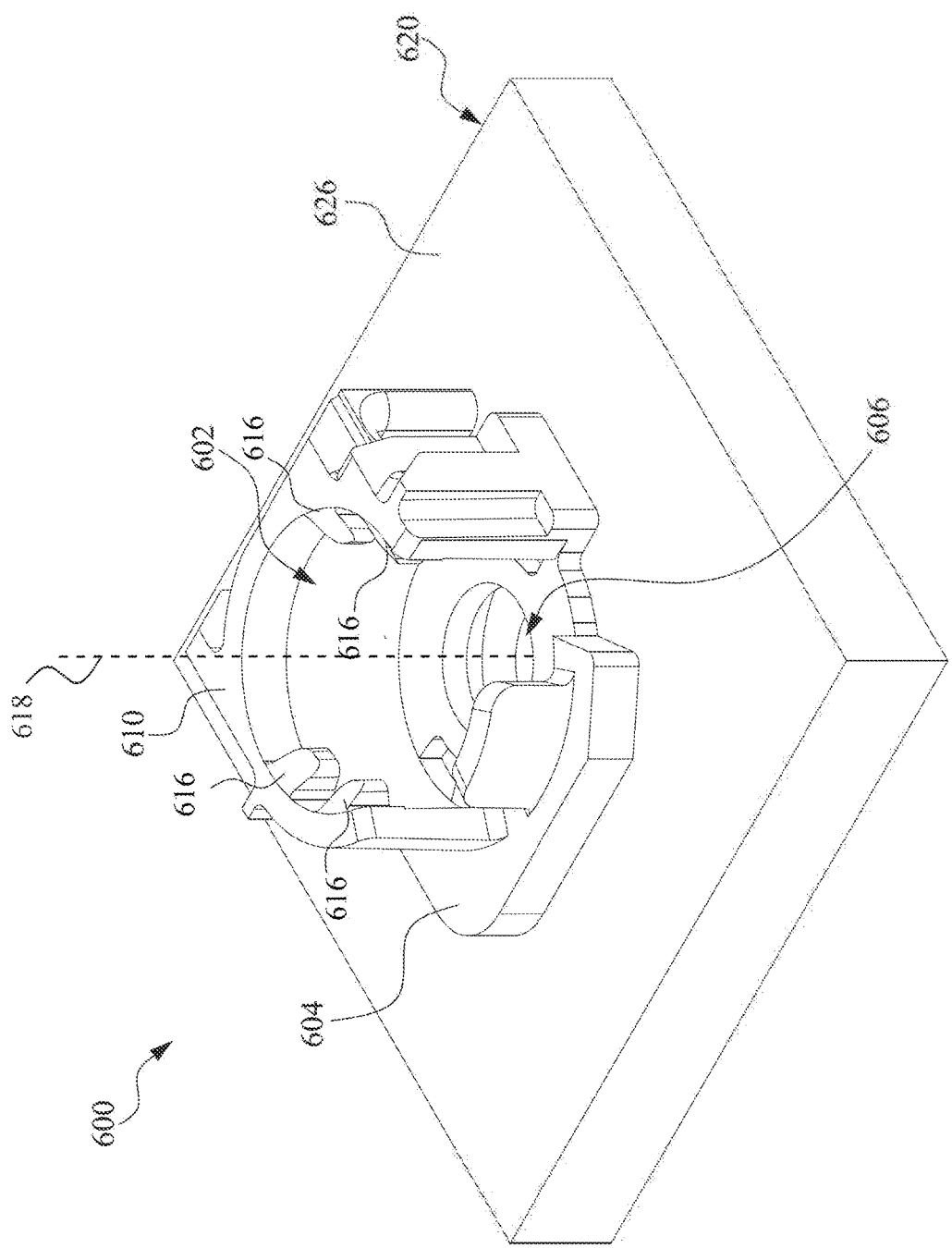
FIG. 6 illustrates a schematic view of a reusable holding component in combination with a pedestal of a heatsink according to an embodiment of the present disclosure.
Figure 7:
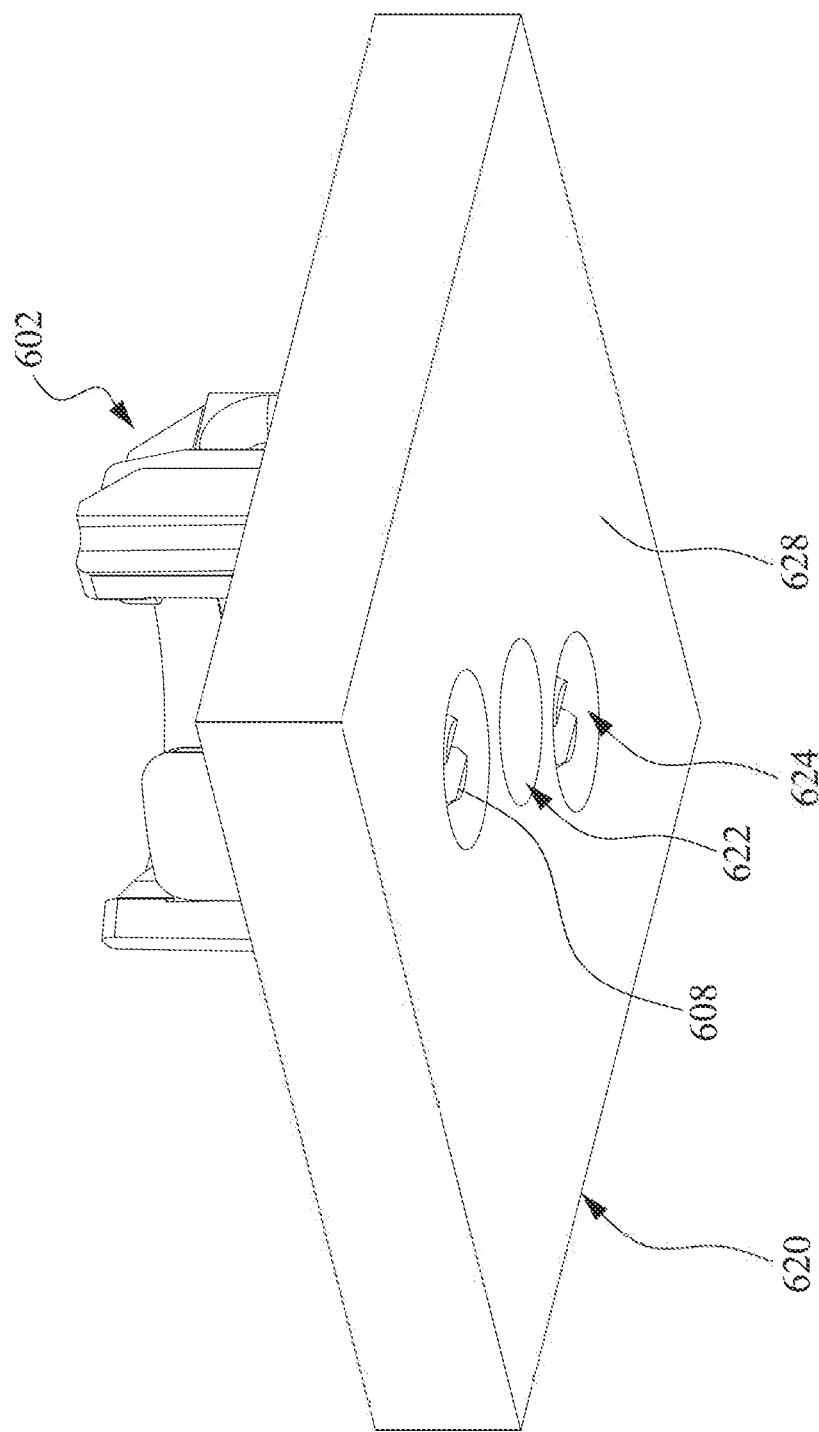
FIG. 7 illustrates another schematic view of the c reusable holding component in combination with the pedestal of the heatsink as shown in FIG. 6.

FIG. 6 illustrates a schematic view of a reusable holding component 602 in combination with a pedestal 620 of a heatsink according to an embodiment of the present disclosure, and FIG. 7 illustrates another schematic view of the combination of the reusable holding component 602 and the pedestal 620 of the heatsink of FIG. 6.

Similar to the reusable holding component of FIG. 1, the reusable holding component 602 may include a frame 604 with a fastener receiving opening 606, at least one pin 608, and a fastener guiding wall 610. The fastener receiving opening 606 extends from a top surface of the frame 604 of the reusable holding component 602 to a bottom surface of the frame 604 of the reusable holding component 602. The at least one pin 608 is disposed on and extending away from the bottom surface of the frame 604 of the reusable holding component 602. The fastener guiding wall 610 is disposed on and extending away from the top surface of the frame 604. The fastener guiding wall 610 may surround the fastener receiving opening 608 of the frame 604. The fastener guiding wall 610 also includes tabs 616 positioned on an opposite end of the fastener guiding wall 610 from the top surface of the frame 604. The tabs 616 extend inward from the fastener guiding wall 610 toward a center line 618 of the fastener receiving opening 606.

Similar to the pedestal of the heatsink of FIG. 3, the pedestal 620 of the heatsink has a top surface 626 and a bottom surface 628. Further, a fastener receiving opening 622 and at least one guiding opening 624 can be formed in the pedestal 620. The fastener receiving opening 622 of the pedestal 620 of the heatsink and the at least one guiding opening 624 of the pedestal 620 of the heatsink may extend from the top surface 626 of the pedestal 620 of the heatsink to the bottom surface 628 of the pedestal 620 of the heatsink.

As shown in FIGS. 6 and 7, the reusable holding component 602 is attached to the pedestal 620 of the heatsink by the at least one pin 608. The bottom surface 628 of the frame 604 of the reusable holding component 602 may engage with the top surface 626 of the pedestal 620 of the heatsink. A fastener receiving opening 624 of the pedestal 620 of the heatsink aligns with the fastener receiving opening 606 of the frame 604 of the reusable holding component 602, and at least one guiding opening 624 of the pedestal 620 of the heatsink corresponds to the at least one pin 608 of the reusable holding component 602.

The at least one pin 608 may include at least two elongated segments with hooks. The hooks are disposed on a head portion of each of the at least two elongated segments, and the hooks extend laterally from the head portion of each of the at least two elongated segments and are tapered off to a point of the head portion of each of the at least two elongated segments. There is a gap between the at least two elongated segments. The reusable holding component 602 may be placed on the top surface 626 of the pedestal 620 of the heatsink, and then the at least one pin 608 may pass through the at least one guiding opening 624 of the pedestal 620 of the heatsink by decreasing the gap between the at least two elongated segments. After passing through the at least one guiding opening 624 of the pedestal 620 of the heatsink, the gap between the at least two elongated segments restores and the reusable holding component 602 is roughly fixed on the pedestal 620 of the heatsink. On the other hand, the operator may press the hooks of the at least one pin 608 to decrease the gap between the at least two elongated segments, such that the at least two elongated segments as well as the hooks of the reusable holding component 602 may retreat from the at least one guiding opening 624 of the pedestal 620. Consequently, the heatsink can be removed easily by the reusable holding component 602 from the pedestal 620 of the heatsink. The installation and the removal of the heatsink as described above will not infect the structure of the reusable holding component 602. As such, the heatsink of the present disclosure can be installed on different pedestals, and can be replaced and used for many times.

In some embodiments, the pedestal 620 of the heatsink with the reusable holding component 602 can be attached to a base (not shown) with a fastener. An electronic component (e.g. the CPU, microprocessor, or the likes) is supported by the base, and the heatsink attached to the base is used for dissipating heat from the electronic component. In some embodiments, the fastener (e.g. a screw with a head portion) may be disposed within the fastener receiving opening 606 of the frame 604 of the reusable holding component 602 and the fastener receiving opening 622 in the pedestal 620 of the heatsink and threaded into the base for securing the heatsink to the base.

In some embodiments, the base may have a fastener receiving opening for receiving the fastener. The fastener may pass through the fastener receiving opening 606 of the frame 604 of the reusable holding component 602, the fastener receiving opening 622 in the pedestal 620 of the heatsink, and the fastener receiving opening of the base. The fastener may include a machine screw with a head portion and a machine nut to secure the pedestal 620 of the heatsink with the reusable holding component 602 to the base.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A reusable holding component, comprising:
   a frame with a fastener receiving opening extending from a first surface of the frame through the frame to a second surface of the frame;
   a fastener guiding wall disposed on and extending away from the first surface of the frame, wherein an internal surface of the fastener guiding wall surrounds the fastener receiving opening of the frame, and wherein the fastener guiding wall guides a fastener into the fastener receiving opening and includes one or more tabs positioned on the internal surface and located on an opposite end of the fastener guiding wall from the first surface of the frame, the tabs include a bottom surface facing to the fastener receiving opening and an opposite top surface inclined toward a center line of the fastener receiving opening; and
   at least one pin extending away from the second surface to a distal end of the at least one pin, wherein the distal end of the at least one pin includes at least two elongated segments with hooks disposed on a head portion of each of the at least two elongated segments, the at least two elongated segments being disposed on the second surface of the frame.

2. The reusable holding component according to claim 1, wherein the at least one pin is vertically extended from the second surface of the frame.

3. The reusable holding component according to claim 1, wherein the frame has a rectangular shape, and at least two pins are disposed at diagonal corners on the second surface of the frame.

4. The reusable holding component according to claim 1, wherein the at least two elongated segments are parallel with each other, and there is a gap between the at least two elongated segments.

5. A heat transfer device, comprising:
   a reusable holding component comprising:
      a frame with a fastener receiving opening extending from a first surface of the frame to a second surface of the frame;
      a fastener guiding wall disposed on and extending away from the first surface of the frame, wherein an internal surface of the fastener guiding wall surrounds the fastener receiving opening of the frame and wherein the fastener guiding wall guides a fastener into the fastener receiving opening and includes one or more tabs positioned on the internal surface and located on an opposite end of the fastener guiding wall from the first surface of the frame, the tabs include a bottom surface facing to the fastener receiving opening and an opposite top surface extending inward inclined toward a center line of the fastener receiving opening; and at least one pin extending away from the second surface to a distal end of the at least one pin, wherein the distal end of the at least one pin includes at least two elongated segments with hooks disposed on a head portion of each of the at least two elongated segments, the at least two elongated segments being disposed on the second surface of the frame; and a heatsink connected to the reusable holding component by the at least one pin, and the heatsink has a fastener receiving opening aligned with the fastener receiving opening of the frame, and at least one guiding opening corresponding to the at least one pin of the reusable holding component.

6. The heat transfer device according to claim 5, wherein the at least one pin is vertically extended from the second surface of the frame.

7. The heat transfer device according to claim 5, wherein the frame has a rectangular shape, and at least two pins are disposed at diagonal corners on the second surface of the frame.

8. The heat transfer device according to claim 5, wherein the at least one guiding opening of the heatsink extends from a first surface of the heatsink to a second surface of the heatsink in a stepped way, and a first diameter of the at least one guiding opening of the heatsink at the first surface of the heatsink is smaller than a second diameter of at least one guiding opening of the heatsink at the second surface of the heatsink.

9. The heat transfer device according to claim 5, wherein the fastener receiving opening of the heatsink extends from a first surface of the heatsink to a second surface of the heatsink in a stepped way, and a first diameter of the fastener receiving opening of the heatsink at the first surface of the heatsink is smaller than a second diameter of the fastener receiving opening of the heatsink at the second surface of the heatsink.

10. The heat transfer device according to claim 5, wherein the at least two elongated segments are parallel with each other, and there is a gap between the at least two elongated segments.

11. The heat transfer device according to claim 5, wherein the at least one guiding opening of the heatsink extends from a first surface of the heatsink to a second surface of the heatsink in a stepped way.

12. The heat transfer device according to claim 5, wherein the fastener receiving opening of the heatsink extends from a first surface of the heatsink to a second surface of the heatsink in a stepped way.

13. The heat transfer device according to claim 5, wherein the at least one guiding opening of the heatsink extends from a first surface of the heatsink to a second surface of the heatsink in a straight way.

14. The heat transfer device according to claim 5, wherein the fastener receiving opening of the heatsink extends from a first surface of the heatsink to a second surface of the heatsink in a straight way.

15. The reusable holding component according to claim 1, wherein the fastener guiding wall comprises a plurality of the tabs, each of the plurality of the tabs extending inward from the fastener guiding wall toward the center line of the fastener receiving opening.

16. The heat transfer device according to claim 5, wherein the fastener guiding wall comprises a plurality of the tabs, each of the plurality of the tabs extending inward from the fastener guiding wall toward the center line of the fastener receiving opening.

* * * * *